(12) United States Patent
Chen

(10) Patent No.: US 7,726,836 B2
(45) Date of Patent: Jun. 1, 2010

(54) LIGHT BULB WITH LIGHT EMITTING ELEMENTS FOR USE IN CONVENTIONAL INCANDESCENT LIGHT BULB SOCKETS

(76) Inventor: Taiming Chen, 150 Forest Hill Dr., Los Gatos, CA (US) 95032

( * ) Notice: Subject to any disclaimer, the term of this patent is extended or adjusted under 35 U.S.C. 154(b) by 0 days.

(21) Appl. No.: 12/008,667

(22) Filed: Jan. 14, 2008

(65) Prior Publication Data
US 2009/0135595 A1   May 28, 2009

Related U.S. Application Data

(60) Provisional application No. 61/004,066, filed on Nov. 23, 2007.

(51) Int. Cl.
 *F21S 4/00* (2006.01)
(52) U.S. Cl. .................. 362/249.02; 361/760
(58) Field of Classification Search .......... 362/230, 362/231, 227, 240, 244, 365, 647, 650, 800, 362/249.01, 249.02; 315/815 R; 340/815.45; 361/760, 792
See application file for complete search history.

(56) References Cited

U.S. PATENT DOCUMENTS

| 5,513,078 | A | * | 4/1996 | Komrska et al. ............ 361/816 |
|---|---|---|---|---|
| 5,688,042 | A | * | 11/1997 | Madadi et al. .............. 362/240 |
| 6,220,722 | B1 | * | 4/2001 | Begemann .................. 362/231 |
| 6,499,860 | B2 | * | 12/2002 | Begemann .................. 362/230 |
| 6,621,222 | B1 | * | 9/2003 | Hong ........................... 315/51 |
| 6,709,132 | B2 | * | 3/2004 | Ishibashi ..................... 362/249 |
| 7,086,756 | B2 | * | 8/2006 | Maxik ......................... 362/249 |
| 7,450,394 | B2 | * | 11/2008 | Ng ............................... 361/760 |
| 2005/0174769 | A1 | * | 8/2005 | Yong et al. .................. 362/235 |
| 2005/0213324 | A1 | * | 9/2005 | Chen ........................... 362/249 |
| 2005/0242734 | A1 | * | 11/2005 | Maxik ......................... 313/634 |
| 2006/0193130 | A1 | * | 8/2006 | Ishibashi ..................... 362/227 |
| 2008/0151535 | A1 | * | 6/2008 | de Castris ................... 362/220 |
| 2008/0174224 | A1 | * | 7/2008 | Liao et al. .............. 313/318.01 |

* cited by examiner

*Primary Examiner*—Hargobind S Sawhney

(57) ABSTRACT

A light bulb apparatus mounted within existing incandescent bulb sockets is comprised of a plurality of interconnecting printed circuit boards (PCBs). An outline shape of any individual PCB is defined in essentially two dimensions a shape or a size of which may vary from one PCB to another. A first portion of this apparatus is equivalent to light bulb cap and is shaped and sized to be fitted into a conventional incandescent bulb socket. At this portion, at least three PCB side edges are lined up against with an inner side wall of a bulb socket. At least one PCB has a tip edge. A second portion of this apparatus is equivalent to a conventional bulb's glass bulb, and a plurality of light emitting devices are mounted on surfaces of the said PCBs and are connected to the circuit laid on boards.

3 Claims, 5 Drawing Sheets

LIGHT BULB WITH LIGHT EMITTING ELEMENTS FOR USE IN CONVENTIONAL INCANDESCENT LIGHT BULB SOCKETS

CROSS-REFERENCE TO RELATED APPLICATIONS

This application is related to and claims priority from U.S. Provisional Patent Application Ser. No. U.S. 61/004,066 filed on Nov. 23, 2007.

FIELD OF THE INVENTION

The present invention relates, in general, to a light bulb apparatus with utilization of light emitting elements and, more particular, this invention relates to a light bulb with light emitting diodes (LEDs) for use in conventional incandescent light bulb sockets.

BACKGROUND OF THE INVENTION

1. Field of the Invention

The present invention relates generally to electrical lighting apparatus, and more particularly to a light bulb apparatus comprising a plurality of light emitting elements, such as light emitting diodes (LEDs), incorporated with printed circuit boards (PCBs) for installation in a conventional incandescent light bulb socket. The present replacement light bulb includes compatible connector and electrical component as required for installation and operation in a conventional incandescent light bulb socket.

2. Description of the Related Art

A number of different principles of electrical lighting have been developed over the years. Incandescent lighting was the first lighting principle to receive widespread use, and is still the most widely used lighting principle used to date. More recently, the principle of electrically exciting a gas to produce light emission from the gas, has been used to produce usable light in the form of fluorescent lighting fixtures and the like. Both principles require air tight enclosures to stop either atmosphere to get in or special gas to leak out.

Other principles of lighting have been developed more recently. Among these is the LED, or light emitting diode. Light emitting diodes (hereinafter referred to as "LEDs" throughout the present disclosure) operate generally as a conventional diode and they also emit light when electric current pass through at one direction. LEDs provide many advantages in lighting, where they may be employed. LEDs are relatively cool in operation, and do not produce any significant amount of heat as a byproduct of their operation. Moreover, they are quite efficient in comparison to other types of lighting principles. LEDs are available in a number of different colors, and the lighting intensity may be varied by means of a simple variable resistor or rheostat, unlike fluorescent lighting. However, even with recently developed "super bright" LEDs, the light output of a single LED is relatively weak in comparison to a conventional fluorescent light unit. Nonetheless, an assembly of a number of LEDs in a single unit or fixture, can provide an equivalent amount of light to an incandescent light bulb.

Accordingly, the present invention provides "drop-in" replacement light bulb units for incandescent light bulbs. The present replacement lighting units comprise various embodiments of Printed Circuit Boards (hereinafter referred to as "PCBs" throughout the present disclosure), each unit containing a plurality of LEDs. The light bulb units also provide support and contact points which make contact and hold securely in the conventional incandescent light bulb sockets found at every household incandescent light fixture. The present invention also includes the electrical components required to adapt the operation of an LED array to the electrical system of a household lighting fixture, with such electrical components being provided internally within the replacement light bulb unit as desired.

U.S. Pat. No. 6,227,679 issued on May 8, 2001 to Zhou Kui Zhang and Zhang Qi Xiang, titled "LED Light Bulb" describes a LED bulb uses LEDs to emit light and fits into a conventional bulb socket. However Kui's design uses conventional bulb cap and a conical base to support the PCB.

U.S. Pat. No. 6,709,132 issued on Mar. 23, 2004 to Kazuo Ishibashi, titled "LED BULB" describes an LED bulb comprises a printed circuit board fits inside a transparent or semi-transparent cover which encloses the printed circuit board formed into a bulb shape cage. However Ishibashi's design uses conventional bulb cap to connect to socket and a cover to define it bulb shape.

U.S. Pat. No. 7,086,756 issued on Aug. 8, 2006 to Fredric S. Maxik titles "Lighting element using electronically activated light emitting elements and method of making the same" describe a LED bulb comprises a flexible printed circuit board with surface mounted LEDs to be fit inside the space of light bulb. However Maxik's design uses conventional bulb cap to connect to socket and conventional glass bulb to keep its shape.

BRIEF SUMMARY OF THE INVENTION

The present invention comprises a replacement light bulb apparatus with light emitting elements for use in conventional incandescent lighting socket, with the present lighting device utilizing a number of relatively low voltage light emitting diodes (LEDs) to produce the desired light.

A series of LEDs are mounted on a plurality of printed circuit boards (PCBs). The LEDs may be in a series or parallel circuit array as desired. A series circuit works well, as the reliability of such LED devices is such that it is unlikely that any will break down, which would result in loss of the entire series circuit. Moreover, a series circuit of LEDs allows the LEDs to act as a series of mutual voltage reduction devices for the other LEDs in the series circuit, thus reducing or eliminating any additional electrical components which might otherwise be required.

The apparatus is comprised of a plurality of interconnecting printed circuit boards (PCBs). Each said PCB has substantial thickness and the outline shape of any individual PCB is defined in essentially two dimensions.

The two dimensional shape or size of the PCBs may vary from one PCB to another so that the final assembly of this apparatus has the form of a distinct three-dimensional sculpture with a recognizable shape of a conventional light bulb. This apparatus can be divided into two portions.

At first portion of this apparatus is equivalent to conventional bulb cap and is shaped and sized to be fit into a conventional incandescent bulb socket. At this portion, at least three PCB side edges mean to line up against inner side wall of a light bulb socket when this apparatus is connected to one. At least one tip edge of PCB is to make contact with electrical contact foot of said bulb socket as tip of a conventional bulb cap.

At second portion of this apparatus where is equivalent to a conventional bulb's glass bulb portion, a plurality of LEDs are mounted on surfaces of these PCBs and connected to the circuit printed on boards. They emit light when the circuit is powered.

DETAILED DESCRIPTION OF THE PREFERRED EMBODIMENT

Figure 1:
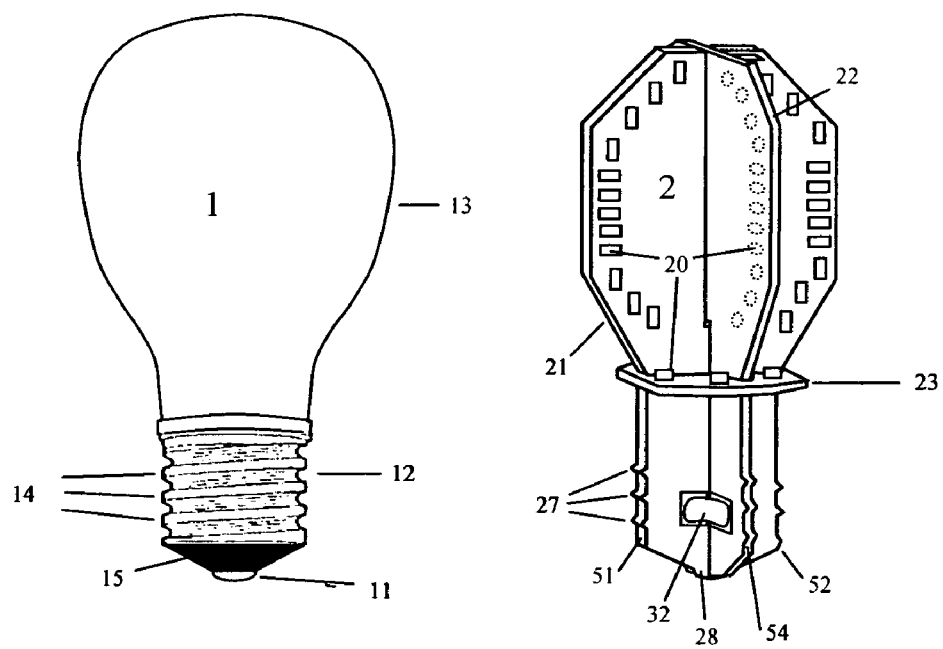
FIG. 1 is a view of a conventional incandescent light bulb side by side with present invention.

Prior to proceeding to the more detailed description of the present invention, it should be noted that, for the sake of clarity and understanding, identical components which have identical functions have been identified with identical reference numerals throughout the several views illustrated in the drawing figures.

FIG. 1 shows a side by side comparison between a conventional incandescent light bulb 1 and present invention LED bulb 2. Conventional incandescent light bulb 1 has glass bulb 13 where emits light and screw cap 12 with bight 14 where connects to a bulb socket 40. Bulb cap tip 11 makes contact to contacting foot 41 of said bulb socket.

Showed present invention 2 is comprised of three Printed circuit Boards (PCBs) 21, 22 and 23. This apparatus 2 can be divided into two portions.

At first portion of this apparatus is equivalent to conventional light bulb cap and is shaped and sized to be fit into a conventional incandescent bulb socket. There are four PCB side edges (51, 52, 53 and 54) to make contacts and hold securely to inner side wall 42 of a said conventional bulb socket 40. There are bumps 27 on all said side edges (51, 52 53 and 54). And end tip edge 28 on PCB 21 to make one more mechanical contact with said contacting foot 41 of a bulb socket.

Another portion of this apparatus where is equivalent to a bulb's glass bulb, a plurality of light emitting devices 20 are mounted on surfaces of said PCBs and connected to the circuit printed on boards. Said light emitting devices emit light when the circuit is powered.

Figure 2:
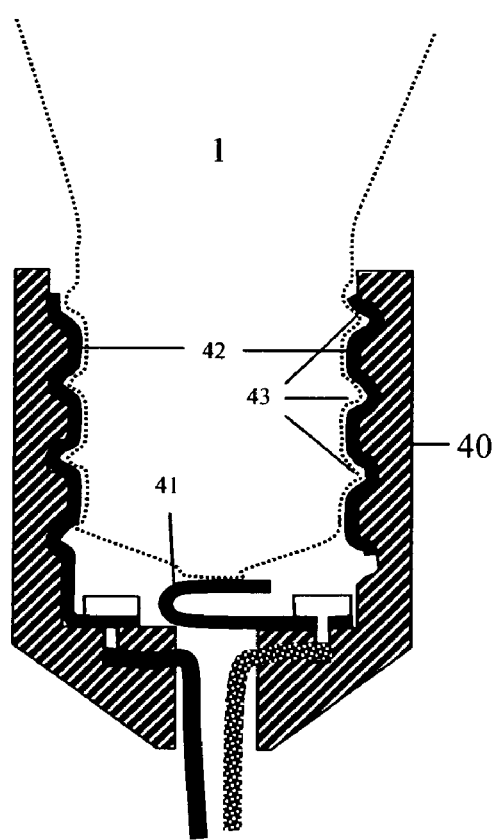
FIG. 2 is a sectional view of a conventional light bulb socket.

FIG. 2 shows sectional view of a conventional light bulb socket 40. There are two electrical terminals, one is inner side wall 42 with one continuous groove 43 on its bight portion, and the other one is contacting foot 41.

Figure 3:
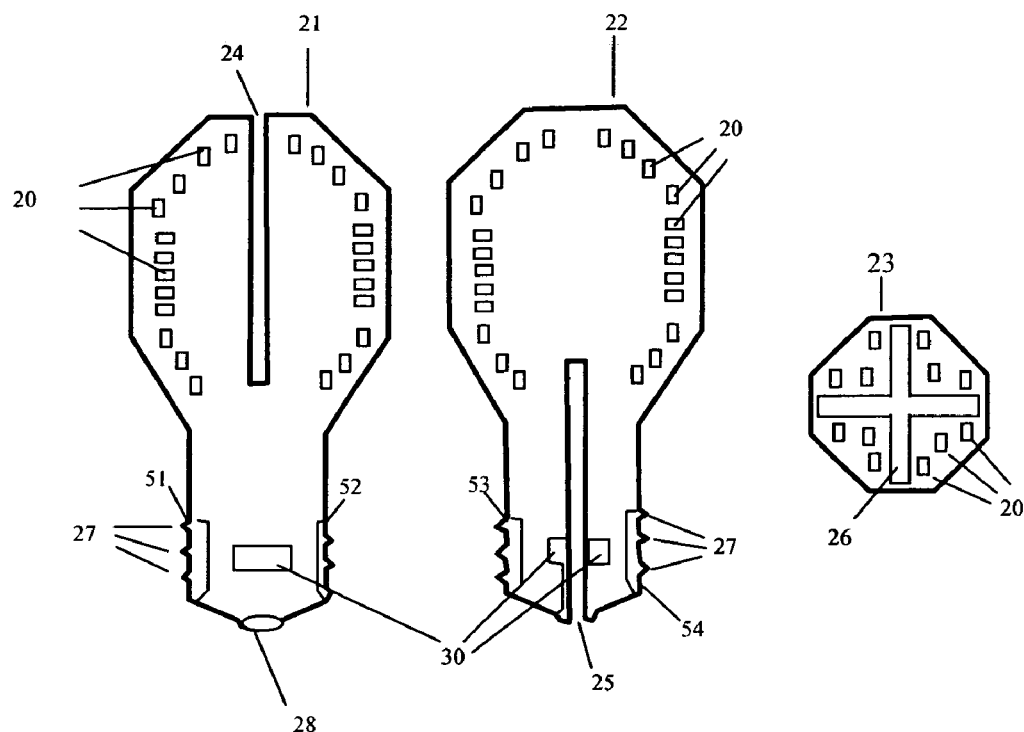
FIG. 3 shows a elevation view of three PCBs of present invention.

FIG. 3 shows those PCBs (21, 22 and 23) in two-dimensional view. These PCBs are made of electrical none-conductive material, such as plastic, wood, glass or even paper, with conductive metal traces and open pads 30 printed on them. PCB 21 has slot 24 for accommodating and interlocking PCB 22 sideway. PCB 22 has slot 25 for accommodating and interlocking with PCB 21 sideway. PCB 23 has cross shape slot 26 to accept interlocked PCB 21 and 22 vertically. There are four side edges 51, 52, 53 and 54 on PCB 21 and 22 to make mechanical contacts with inner side wall 42 of said bulb socket and one tip edge 28 on PCB 21 to make one more mechanical contact with said contacting foot 41 of a bulb socket.

PCB 21 and 22 has a thickness which is equal to or slightly less than the distance which separates the side edges of slots (24, 25 and 26) so they can slide into slots of others sideway. When PCB 21 and 22 are assembled together (with PCB 23 optional), they form of a distinct three-dimensional sculpture 2 with a recognizable shape of a conventional light bulb 1.

A plurality of Light Emitting Diodes (LEDs) 20 are mounted on surface of PCB 21, 22 and 23. There are open metal pads 30 on PCB 21 and 22 for soldering.

Figure 4:
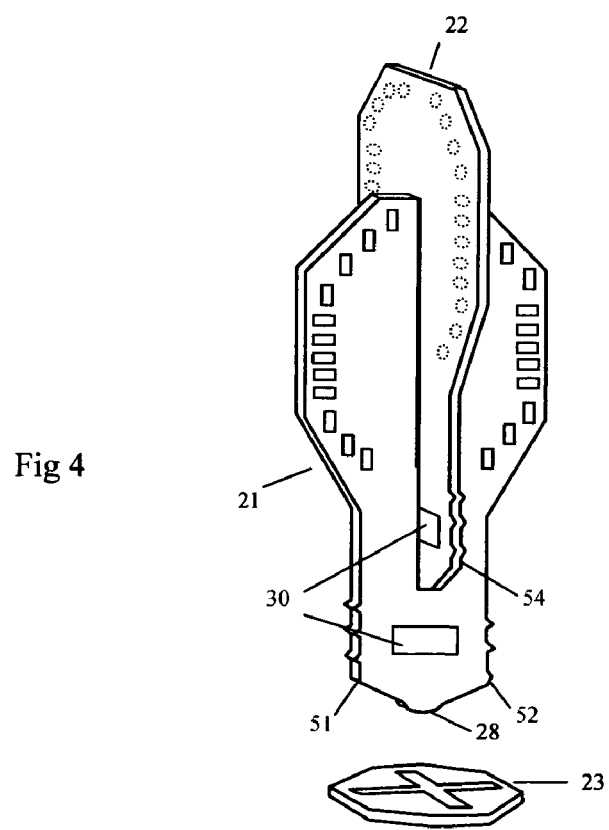
FIG. 4 is a perspective view of two PCBs sliding into interlocking position.

FIG. 4 shows PCB 21 and 22 are sliding into interlocking position with each other. And PCB 23 is in a position ready to accept interlocked PCB 21 and 22.

Figure 5:
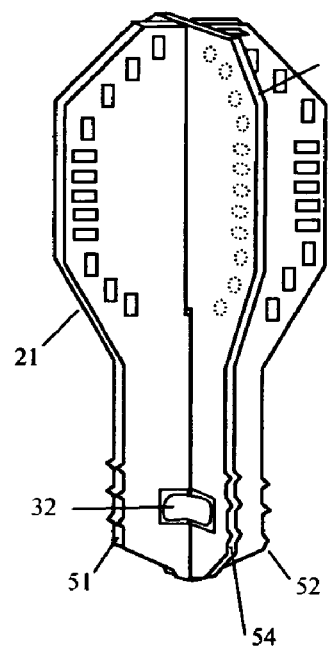
FIG. 5 is a perspective view of a complete light bulb apparatus without the optional third PCB.

FIG. 5 shows a least one solder joint 32 has been applied on open metal pads 30 on PCB 21 and PCB 22 to joint them together.

Figure 6:
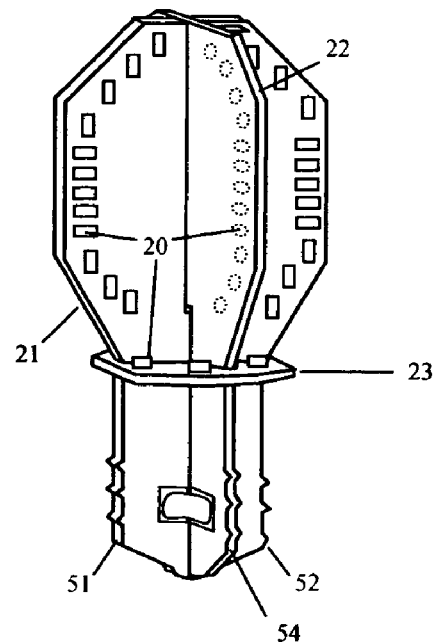
FIG. 6 is a perspective view of a complete light bulb apparatus with the optional third PCB.

FIG. 6 shows PCB 23 has accepted and interlocked with PCB 21 and 22. Optional PCB 23 is connected to PCB 21 and 22 via at least 2 solider joints 32. Electricity can be transferred onto PCB 23 via these joints 32.

Figure 7:
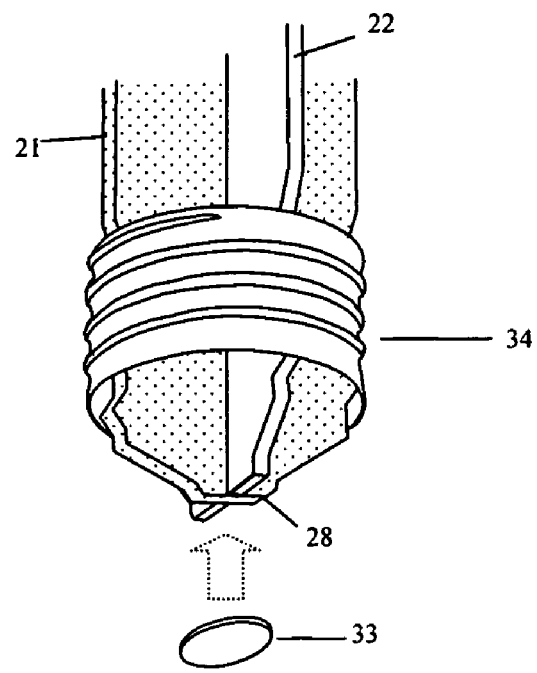
FIG. 7 is a partial perspective view of light bulb cap portion of this apparatus with first design.

FIG. 7 shows the first design of socket connecting (first) portion of present invention 2 to light bulb socket. An electrical conductive sleeve 34 with helical thread bight is mounted on one end of current invention 2 in order to. work with helical screw bight of a light bulb socket.

Figure 8:
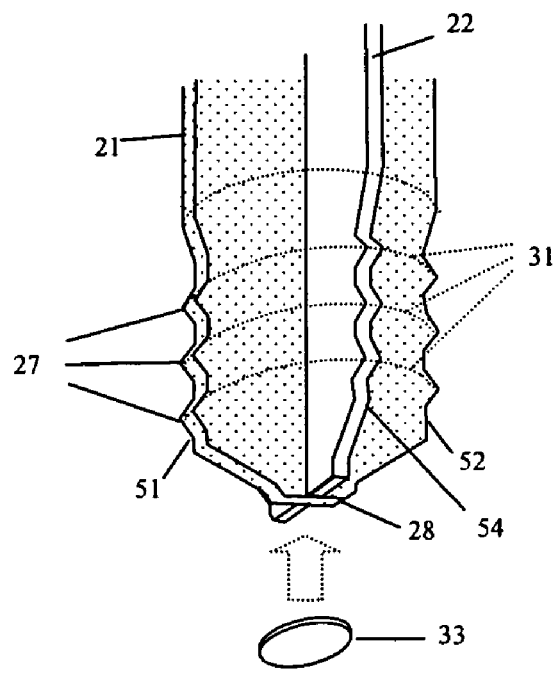
FIG. 8 is a partial perspective view of light bulb cap portion of this apparatus with second design.

FIG. 8 shows the second design of socket connecting portion of present invention 2. Bumps 27 are on all four side edges (51, 52, 53 and 54) of PCB 21 and 22 to align with light bulb socket helical screw groove thread 31. An optional end cap 33 can be mounted on tip edge 28 of current invention 2.

Showed invention 2 holds four side edges (51, 52, 53 and 54) and one tip edge 28 are rigidly in position to make mechanical contacts with bulb socket 40 when screwed into one. When screwed in to a socket, the bumps 27 on all four side edges (51, 52, 53 and 54) are in groove 43 of bight portion of bulb socket 40 to prevent any other movement except the direction following bight's helical thread.

Tip edge 28 is covered with conductive metal coating and works as one electrical terminal to provide one electrical contact for circuit printed on PCB 21. And electricity can be transferred to circuit printed on PCB 22 via solder joints 32. All four side edges (51, 52, 53 and 54) are also covered with conductive metal coating and work as another terminal to provide another electrical contact for PCB 21 and 22.

Figure 9:
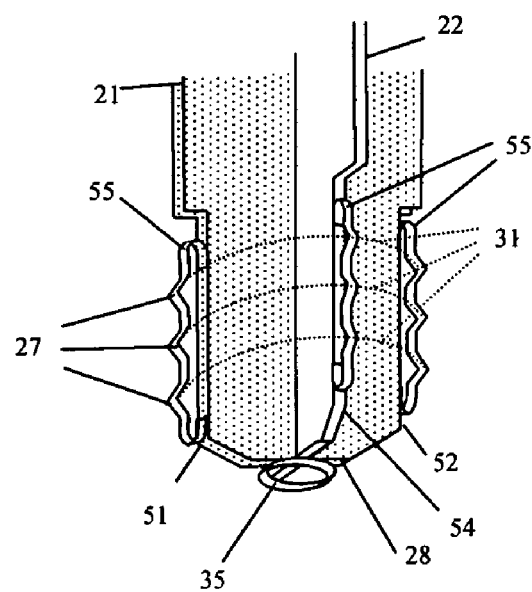
FIG. 9 is a partial perspective view of light bulb cap portion of this apparatus with third design.

FIG. 9 shows the third design of socket connecting portion of present invention 2. Elastic metal strips 55 with bumps 27 are mounted on all four edges (51, 52, 53 and 54) of PCB 21 and 22. All bumps are aligned with light bulb socket helical screw groove thread 31. An elastic metal end contact 35 is mounted on tip edge 28 of current invention 2. Since all mounting contacts are elastic instead of rigid, a bulb with this design can be forced into socket directly instead of screwed into position LEDs 20 on PCB 21, 22 and 23 emit light when circuit printed on PCBs is powered.

Figure 10:
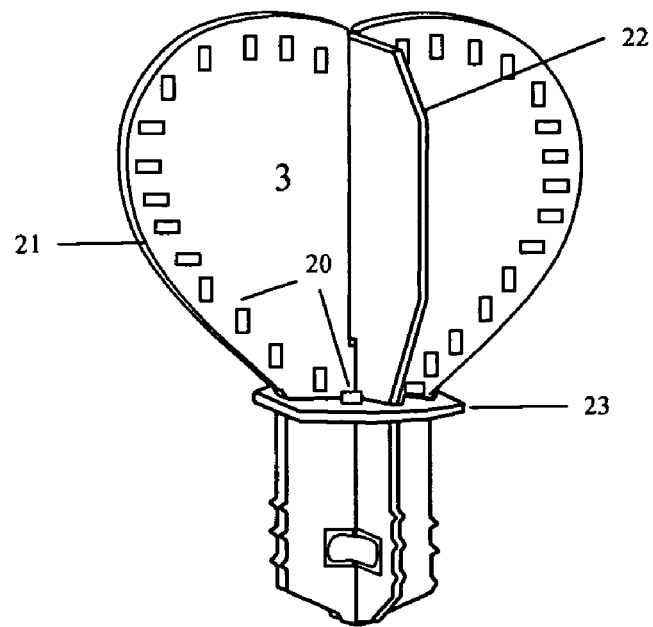
FIG. 10 is a perspective view of this apparatus with a PCB panel with special shape.

Shapes other than traditional light bulb shape can also be used. FIG. 10 shows a present invention 3 with a shape of heart for decoration purpose.

I claim:

1. A lighting apparatus for replacement of a conventional incandescent light bulb, said lighting apparatus comprising:
   an arrangement of a plurality of interconnecting printed circuit boards (PCBs) forming a three dimensional light bulb shape round sculpture; each said PCB being a plane of a predetermined thickness wherein shapes of the planes of the PCBs selected from similar shapes and different shapes;

said three-dimensional light bulb shape comprising a first portion sized to be fitted into an Edison-type light bulb socket; at least three of the said edges of said plurality of interconnecting PCBs at said first portion being butted against an inner side wall of a conventional incandescent light bulb socket when said PCBs are connected to one another;

at least one PCB tip edge at said first portion protruding from an electrical contacting foot of said bulb socket when said at least three PCBs are connected to one another;

said three-dimensional light bulb shape comprising a second portion in the round sculpture which is equivalent to a glass bulb part of said conventional light bulb; said second portion serving for enveloping light emitting elements mounted on surfaces of said PCBs, and are connected to circuit-laid on said PCBs; and wherein each of said side edges has at least one bump; the bumps on all said side edges are arranged so their outlines align with sectional lines at said inner side wall as the light apparatus is fully screwed into the socket.

2. The light apparatus according to claim 1 further comprising:

wherein said side edges with bumps are elastic extensions of said PCBs; subsequent to their alignment with the inner sidewall of said bulb socket, said elastic bumps are forcefully insertable into said bulb socket; said insertion of said elastic bumps into said bulb socket does not require them to be threaded into said bulb socket; and full insertion of said light apparatus into said bulb socket produces direct contact between said elastic bumps and inner wall sidewall of said bulb socket.

3. The light apparatus according to claim 1 further comprising: wherein each of said interconnecting PCBs has a slots for interlocking PCBs with one another; said PCBs has thickness which is equal to or slightly less than a distance which separates side edges of said slots so that said PCBs slide into slots of other of PCBs sideway.

* * * * *